(12) United States Patent
Campardo et al.

(10) Patent No.: US 6,301,152 B1
(45) Date of Patent: Oct. 9, 2001

(54) NON-VOLATILE MEMORY DEVICE WITH ROW REDUNDANCY

(75) Inventors: Giovanni Campardo, Bergamo; Alessandro Manstretta, Broni; Rino Micheloni, Turate, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/570,332

(22) Filed: May 12, 2000

(30) Foreign Application Priority Data

May 12, 1999 (EP) .................................................. 99830286

(51) Int. Cl.[7] .................................................. G11C 16/06
(52) U.S. Cl. ............... 365/185.09; 365/200; 365/185.11; 365/185.13; 365/230.06
(58) Field of Search ............................... 365/185.09, 200, 365/201, 230.03, 230.06, 185.13, 185.11

(56) References Cited

U.S. PATENT DOCUMENTS

| | | | |
|---|---|---|---|
| 5,355,337 | 10/1994 | Kim | 365/200 |
| 5,748,528 * | 5/1998 | Campardo et al. | 365/185.13 |
| 6,067,260 * | 5/2000 | Ooishi et al. | 365/200 |
| 6,128,244 * | 10/2000 | Thompson et al. | 365/230.03 |
| 6,151,263 * | 11/2000 | Kyung et al. | 365/230.03 |

* cited by examiner

*Primary Examiner*—David Nelms
*Assistant Examiner*—David Lam
(74) *Attorney, Agent, or Firm*—Theodore E. Galanthay; Robert Iannucci; Seed IP Law Group, PLLC

(57) ABSTRACT

A non-volatile memory device is organized with memory cells that are arranged by row and by column. The memory device includes a sector of matrix cells, row decoders and column decoders suitable to decode address signals and to activate respectively the rows or said columns, at least a sector of redundancy cells such that it is possible to substitute a row of the sector of matrix cells with a row of the sector of redundancy cells. The non-volatile memory device comprises a local column decoder for the matrix sector and a local column decoder for the redundancy sector. The local column decoders are controlled by external signals so that the row of the redundancy sector is activated simultaneously with the row of the matrix sector.

19 Claims, 7 Drawing Sheets

NON-VOLATILE MEMORY DEVICE WITH ROW REDUNDANCY

BACKGROUND OF THE INVENTION

The present invention refers to a non-volatile memory device. In particular the aforementioned in vention refers to a non-volatile memory device with row redunddancy.

BACKGROUND OF THE INVENTION

In a non-volatile semiconductor memory device (EPROM or Flash) it is necessary that the matrix of memory cells contained therein has all the cells perfectly working during the various operation stages of the device (reading, programming, erasing). In fact, the presence of only one non working cell (bit-fail) is sufficient for the entire memory device to become useless. Such failure of the memory cell is ascribable, for example, to causes deriving from the technological process, such as the existence of conductive layers short-circuiting with each other, the variation of some process parameters, and the failure of the dielectric layers. It is therefore necessary to avail of adequate expedients within the memory device that allow one to detect and to correct bit-fails, and therefore to increase the production yield of the memory devices. To this purpose, circuit solutions for the correction and the recognition of bit-fail are utilized. A traditionally utilized technique consists in the use of memory cells in addition to the ones constituting the memory matrix that are purposed to substitute the damaged memory cells. Such memory cells, named redundancy cells, are opportunely controlled by circuits additional to the ones that are already present within the device. In particular, in view of the organization of the memory it is necessary to use entire rows or entire columns made up of redundancy memory cells that substitute corresponding rows or columns of the matrix even in the presence of a single bit-fail located in them. In this way it is necessary to make a compromise between the failure correcting capacity and the area required for the redundancy handling circuits.

The choice of the type of organization of the redundancy cells to be utilized in the memory device (row redundancy, column redundancy, or both) is essentially tied to the knowledge of the distribution and of the typology of the defects present in the matrix for a fixed integration technology process.

FIG. 1 shows the simplified architecture of a flash type non-volatile memory utilizing the row redundancy technique. The architecture includes a cell matrix 1 orderly organized into rows and columns, a row decoder block 2 purposed to decode the row addresses, a column decoder block 3 purposed to decode the column addresses, a reading block containing the reading circuits (sense amplifiers) 4, and an output buffer 5. For exemplifying but not limiting purpose an architecture with a single redundancy sector 7 for the correction of bit-fails equally probably distributed in all the matrix sectors has been assumed. In a flash memory the cell matrix is divided into different units or sectors having prefixed capacity. The selective access to the sectors is obtained by providing an organization of the sectors by rows or by columns, as well as a physical separation of the source lines of each sector. In the first case the columns are shared among all sectors and the selection of the sector is made by using the row address, while in the second case the rows are shared among the sectors and the selection is made on the column address. In addition, it is possible to realize a hierarchic row (column) organization that consists in the realization of global rows (columns), that means that they are shared among all sectors, to which the local lines (columns) of the single sectors are connected which are enabled only for the sector being selected.

The detection of the defective cells takes place during the testing stage of the device. In the presence of defective cells, an onchip control circuitry allows the substitution of the entire matrix row with a redundant row, in such a way that the access to the latter is completely transparent for the final user. This operation consists in the permanent memorization of the address of the defective row by means of non-volatile memory cells named UPROM (Unerasable Programmable ROM) 10. The UPROM cells referring to a redundant row are organized in a register suitable to permanently contain the address that was set during the testing stage. In this way, at each access to the memory, the row address being selected must be compared with the content of the redundancy registers. Each register memorizes a row address and allows the selection of the corresponding redundant row before carrying out a reading, programming or erasing operation.

In order to ensure the maximum corrective power for a prefixed number of rows per sector, that is the maximum number of retrievable bit-fails in a sector by substitution of the corresponding row, it should be necessary to fix a number of redundancy rows equal to the number of rows in the sector (one to one correspondence). In practice, this choice turns out to be disadvantageous because of the area required by the redundancy management circuits, therefore the number of redundancy rows is fixed at a value lower than the one of the sector rows since a compromise is made between a the corrective power and the area occupied on silicon. In this way a redundant row can substitute only a prefixed row within the set of a prefixed number of sector rows (therefore with a many-to-one correspondence between the rows in a sector and the redundancy row). This choice allows in any case the correction of a bit-fail equally distributed on all sectors of the matrix.

With the architecture of the known art, the redundancy rows are pre-decoded by the same row decoding signals of the matrix sectors. The row decoding takes up a sufficient number of bits of the row address for the generation of Nm signals of row selection (P0, P1 . . . PNm-1). In the architecture of the row decoding with the known art, the aforementioned decoding signals enable an equal number of selection transistors (typically N-channel MOS transistors) for the connection of the row to the predecoding logic located downstream. In an analogous way the redundancy rows are selected by Nr signals PR0, PR1 . . . PRNr-1. Two cases can occur, that are reported in FIGS. 2 and 3, where a hierarchic row decoding has been assumed.

If Nm>Nr, each redundancy row of the sector 210 is shared by groups 10 with Nm/Nr rows of the matrix sectors 200 and the selection signal of the redundancy row is activated only if at least one row of the group 10 is activated, therefore, for example, PR0=P0 or P1 or P2 . . . or P(Nm/Nr-1) (FIG. 2).

If Nm=Nr, a single row of the matrix sector 200 is associated with each redundancy row of the sector 210, as they are both decoded by the same signal, therefore, for example, PR0=P0 (FIG. 3). Such solution allows the maximum corrective power.

In a Flash memory architecture utilizing the row redundancy technique, according to the solution of the known art, the redundancy cells and the matrix ones share the same bit-lines. Said redundancy cells can be realized in a dedicated sector or distributed inside each matrix sector. In addition the redundancy cells share the source line that must be in turn electrically shared with the one of the matrix rows with which they will be associated. This condition is essential since the architecture of a Flash memory imposes that the redundancy cells must be erased simultaneously with the ones of the sector they are referred to.

The access time of a memory word in an architecture utilizing the row redundancy technique turns out to be greater than the one obtainable with memory architectures that do not use this technique. This access time depends, for example, on the delays of propagation of the signals along the interconnection lines caused by the non-ideal effects due to their physical realization, and on the time required to carry out the comparison between row addresses and the subsequent selection of the redundant row.

FIG. 4 shows the time diagram of an access to a word in memory evaluated with reference to the commutation of the external address in the case of architecture without row redundancy. The access time comprises the acquisition of the address signal (buffer in), the decoding of the row and column addresses (decoding), the precharging of the selected word line (word line precharging) and column line (bit line precharging) and the subsequent reading (sensing) of the cell content. The datum is transmitted in output by means of a buffer out.

In the case of row redundancy, shown in FIG. 5, the access time becomes greater since a pre-established time passes (UPROM evaluation), that is necessary to the internal circuitry for the determination of the redundancy conditions for the selected row, before being able to apply the word line precharging.

The solution of the known art provides for the precharging of a single row (the selected one if the latter is not redundated, or the redundancy one in the opposite case) for each address change that is imposed from the outside. This reading technique is a consequence of the condition of column share that prevents the simultaneous selection of two cells along the same bit-line. For this reason, with the architectures of memories of the known art, it is necessary to wait for the redundancy event before recharging the row, with a consequent penalization in access time.

SUMMARY OF THE INVENTION

An embodiment of the present invention realizes a non-volatile memory device with row redundancy technique, in which the access time to a memory word is noticeably reduced with respect to prior art non-volatile memories.

The non-volatile memory device is organized with memory cells arranged by rows and by columns, comprising at least one sector of matrix cells, row and column decoders suitable to decode address signals and to activate respectively the rows or the columns, at least one sector of redundancy cells such that it is possible to substitute a row of said sector of matrix cells with a row of the sector of redundancy cells. The memory device also includes a local column decoder for the sector of matrix and a local column decoder of the sector of redundancy, the local column decoders being controlled by external signals so that the row of the redundancy sector is activated simultaneously with the row of the matrix sector.

BRIEF DESCRIPTION OF THE DRAWINGS

The characteristics and the advantages of the present invention will become evident from the following detailed description of an embodiment thereof, that is illustrated as a non limiting example in the enclosed drawings, in which.

DETAILED DESCRIPTION OF THE INVENTION

Figure 1:
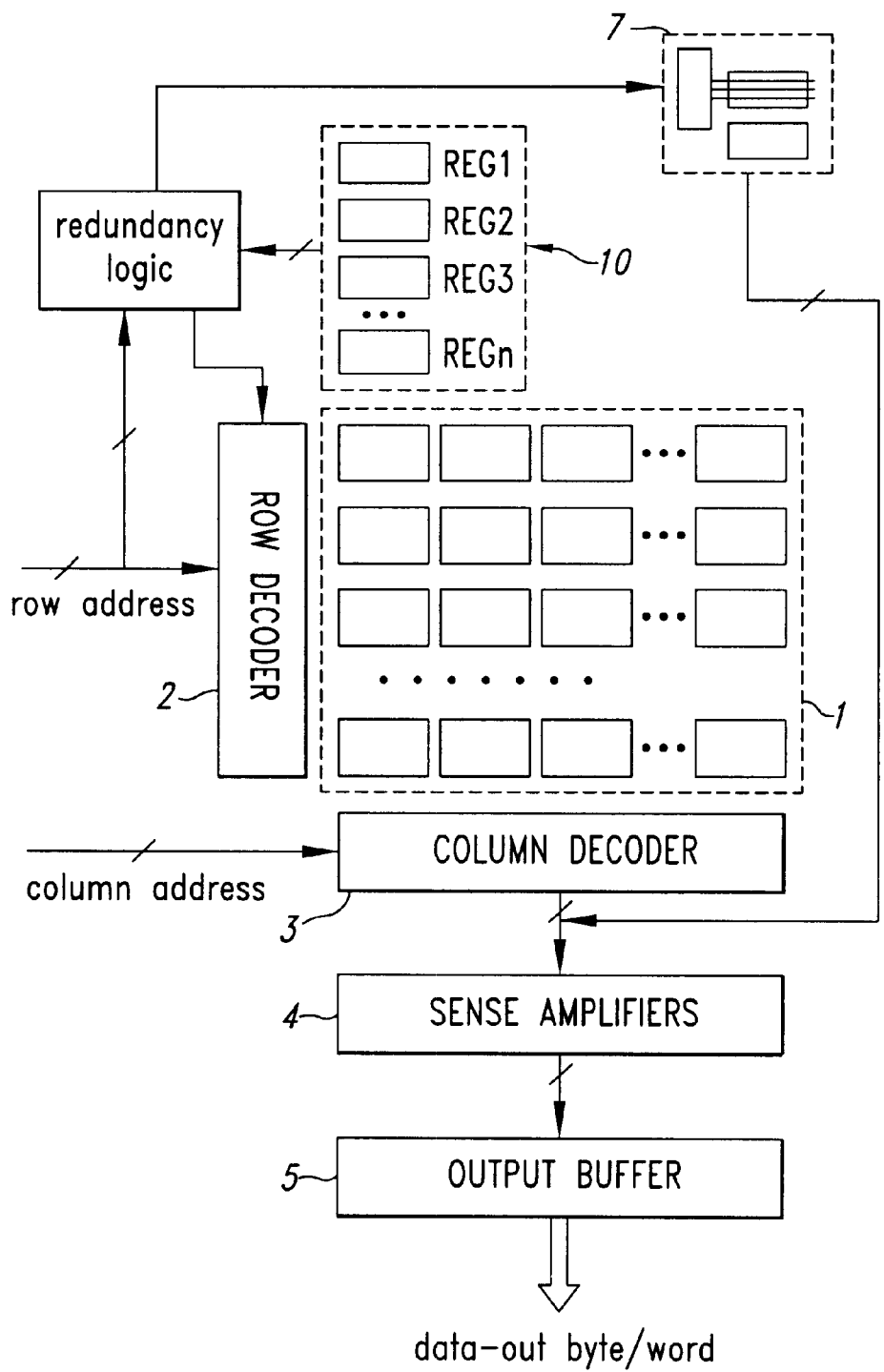
FIG. 1 is a schematic view of a non-volatile memory device of the traditional Flash type.
Figure 2:
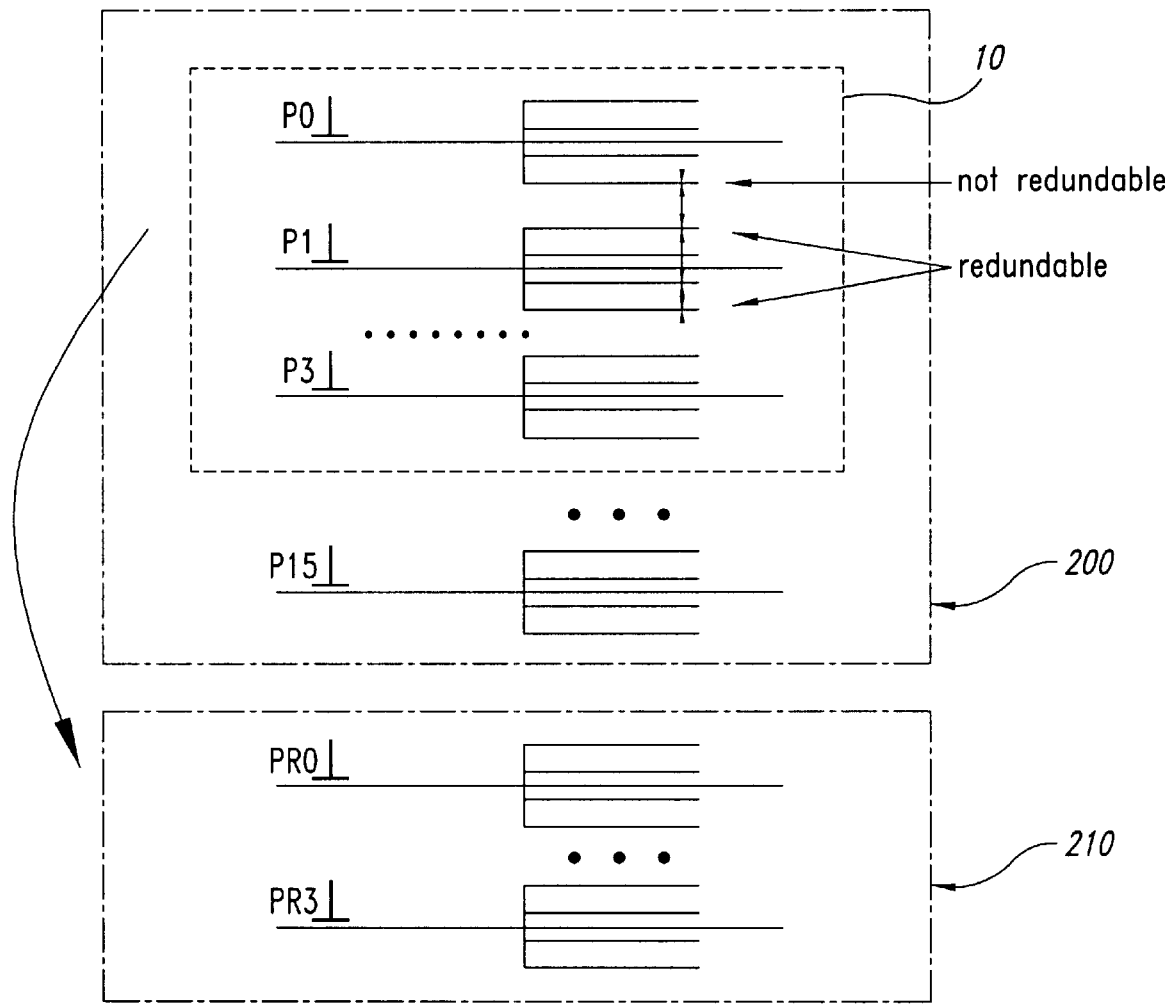
FIG. 2 shows a schematic view of a row by a traditional type redundancy method.
Figure 3:
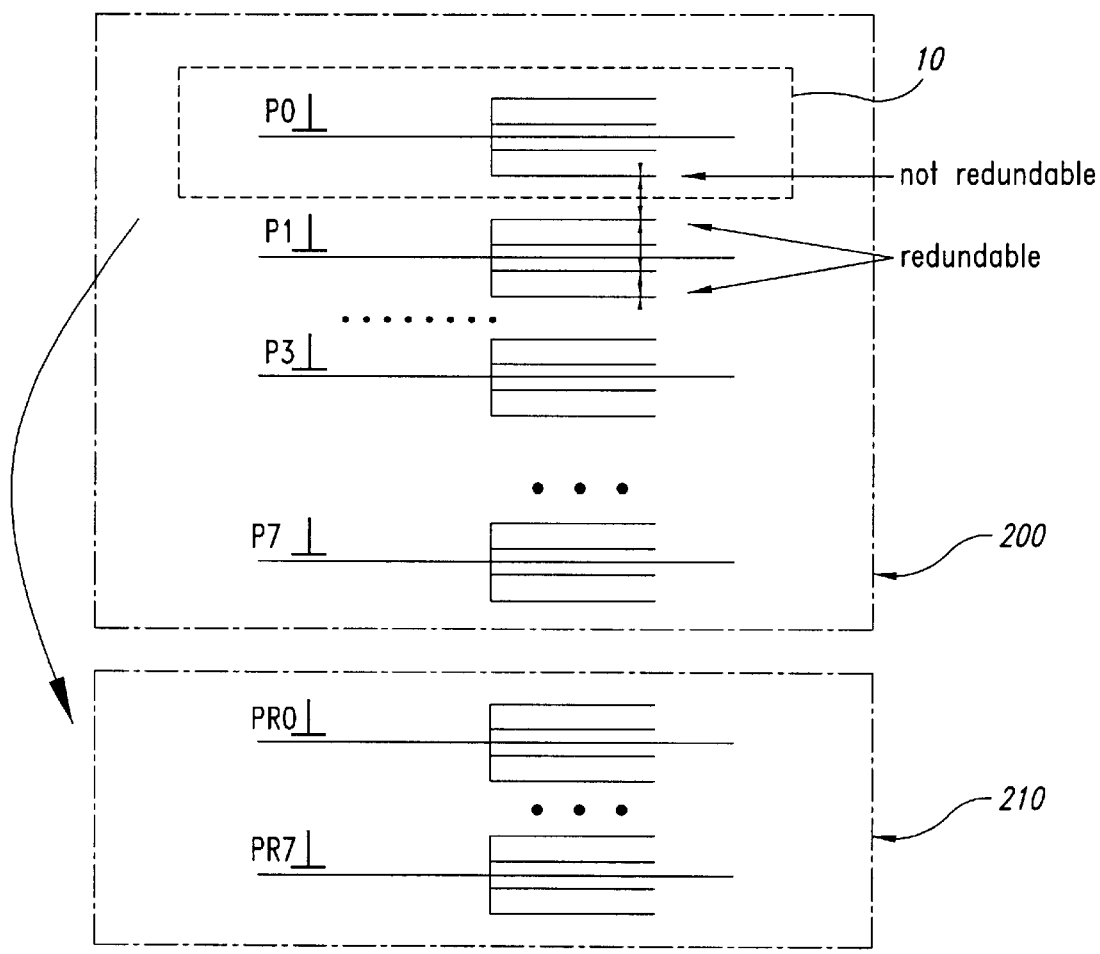
FIG. 3 shows a schematic view of a row by a redundancy method according to the present invention.
Figure 4:
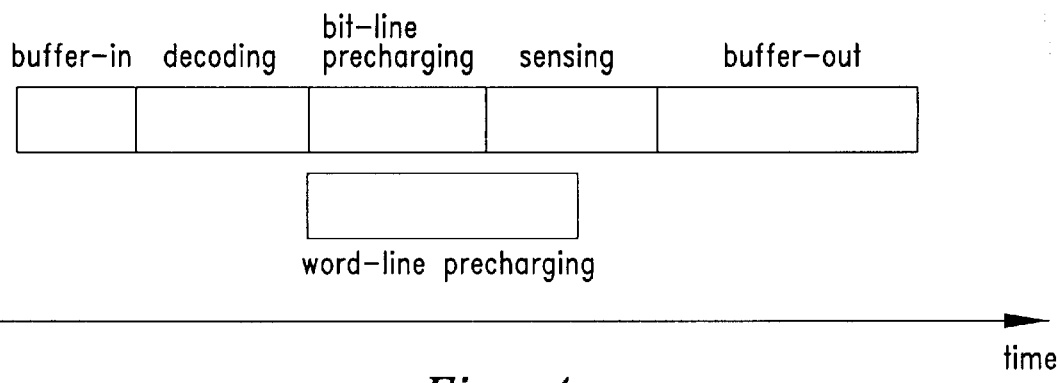
FIG. 4 shows the access time diagram to a memory word in the case in which there is no row redundancy.
Figure 5:
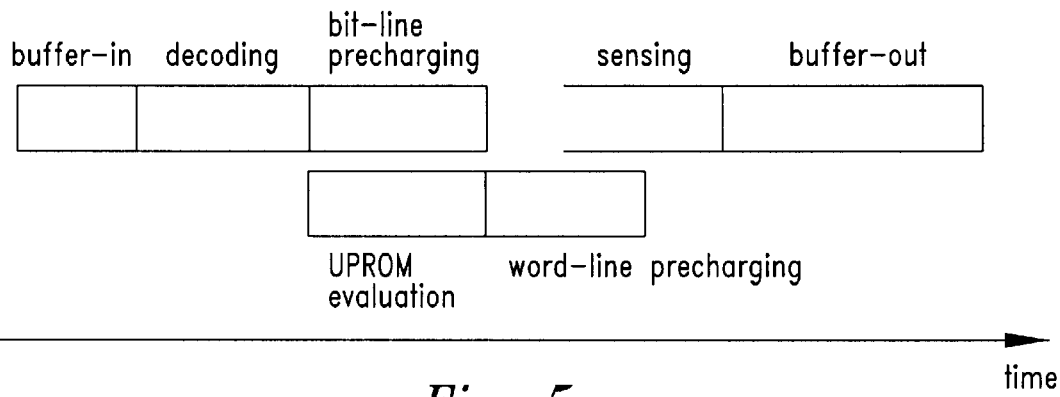
FIG. 5 shows the access time diagram to a memory word in the case in which there is row redundancy, according to the known art.
Figure 7:
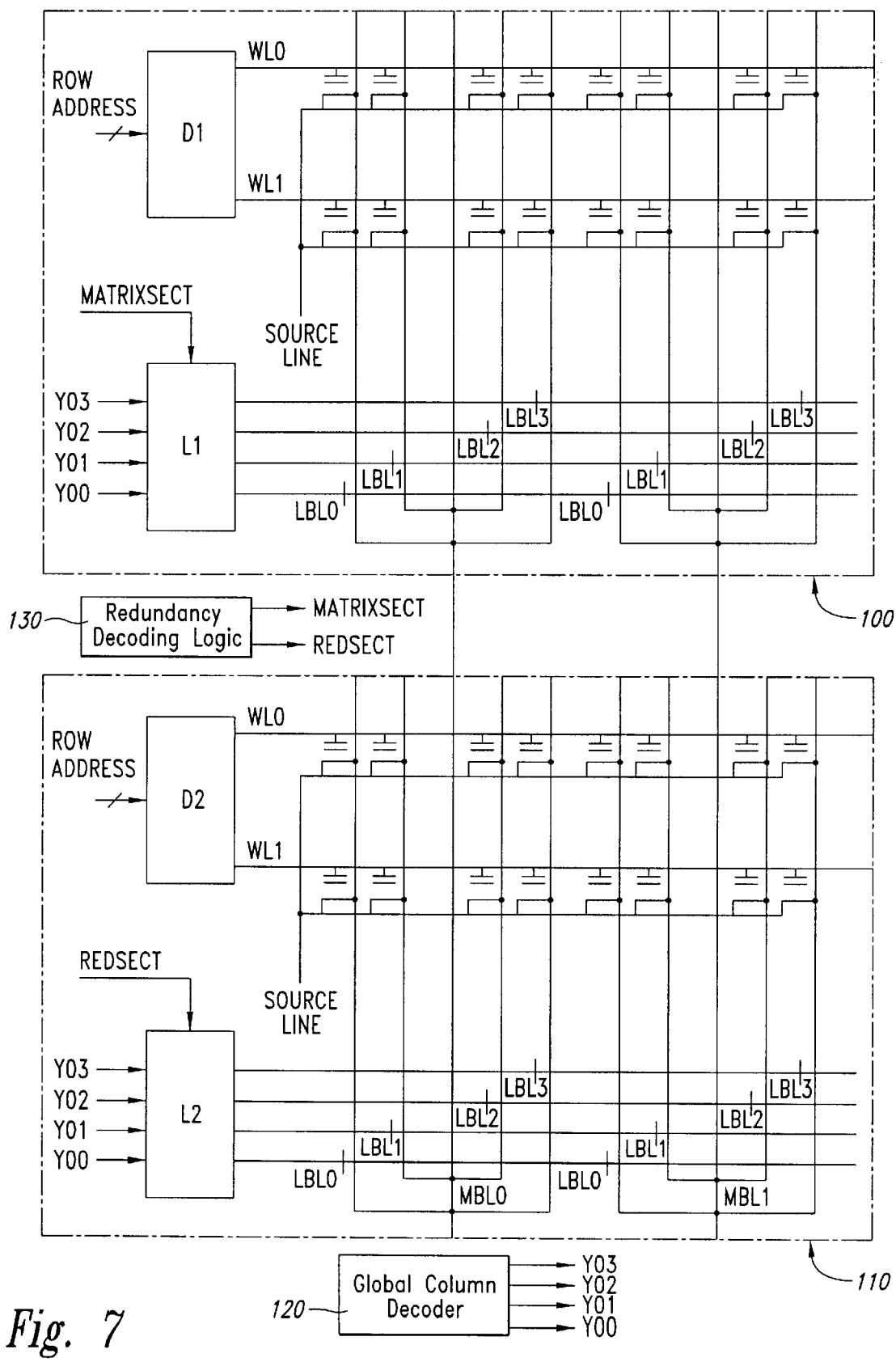
FIG. 7 shows a detail of a memory architecture according to an embodiment of the present invention.

With reference to the attached figures and particularly to FIG. 7, a detail of a Flash memory architecture utilizing the row redundancy method according to an embodiment of the present invention is shown. In FIG. 7 there are shown a matrix sector 100 and a prefixed number of redundancy rows that are realized in a dedicated sector 110. The memory architecture utilizes a first local column decoder LI for the matrix sector and a second local column decoder L2 for the redundancy sector 110. The memory architecture employs a hierarchic row and column organization, therefore FIG. 7 for each sector 100, 110 reports two global rows WL0, WL1 connected to an appropriate decoder D1, D2 which decodes the row addresses and two global columns MBL0, MBL1. Four local columns LBL0–LBL3 are connected with each one of the global columns MBL0, MBL1. The local columns are decoded by the respective local column decoder L1, L2 that is selected by respective sector selection signal MATRIXSECT, REDSECT corresponding to the sector being selected. Such a local column decoder L1, L2 decodes signals YO0–YO3 coming from a suitable global column decoder 120. Such sector selection signals are obtained from the external signal by means of decoding logic 130. The decoding logic 130 is similar to the redundancy logic of FIG. 1; the decoding logic 130 issues the REDSECT selection signal if the addressed portion of the cell matrix sector 100 includes a defective cell and issues the MATRIXSECT selection signal otherwise. The row decoding signals are shared by both the matrix sector 100 and the redundancy sector 110. In this organization, each sector row can be replaced only by the redundancy row to which the same predecoding signals correspond. The number of decoding signals of the matrix sector rows is generally higher than the number of decoding signals of the redundancy rows, that is Nm>Nr, or in order to maximize the corrective power for a prefixed number of redundancy rows, the number of decoding signals of the matrix sector rows may be fixed equal to the one of the selection signals of the redundancy rows, that is Nm=Nr.

The source lines of the redundancy cells are connected to electrically each other and to a power generator by means of a selector circuit that is not visible in figure.

Figure 6:
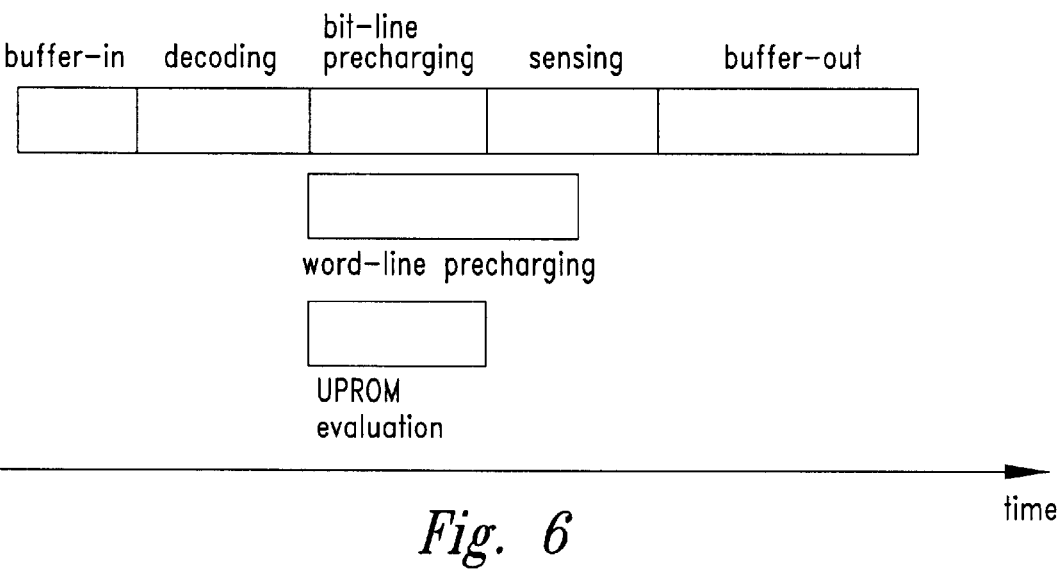
FIG. 6 shows the access time diagram to a memory word in the case in which there is row redundancy, according to the present invention.

In FIG. 6 the time diagram relative to the access to a word, according to the invention, is shown. Differently from the traditional techniques in a stage following the decoding of the row and column addresses there is simultaneously a precharging of both the addressed memory row (word line precharging) and the corresponding redundancy row (UPROM evaluation). This is possible because the matrix 100 and redundancy 110 sectors each have separate local bit lines. The corresponding redundancy row represents the row that is associated with a matrix row and that substitutes for the latter in the case that the matrix line is detective. The selection of the matrix cell or of the corresponding redundancy cell is made by selecting the column only at the end of the time required by the redundancy decoding logic to issue either the MATRIXSECT selection signal (no defective cells addressed) or the REDSECT selection signal (defective cell in matrix sector 100 so redundancy sector 110 is accessed instead). In such way the precharging is made simultaneously with the comparison between the address and content of the UPROM registers so that the row is already precharged at the value required to carry out the reading operation at the end of the comparison.

Figure 8:
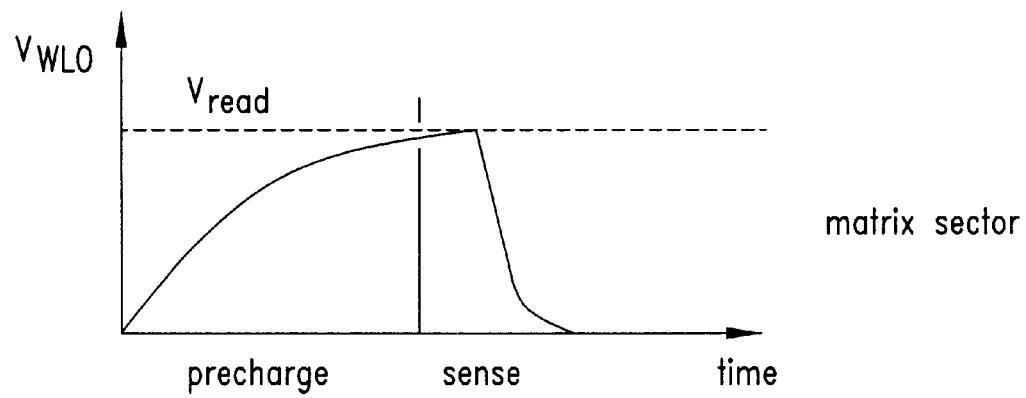
FIG. 8 shows a time diagram of the word-line tension in the case of redundated matrix, according to the invention.
Figure 8:
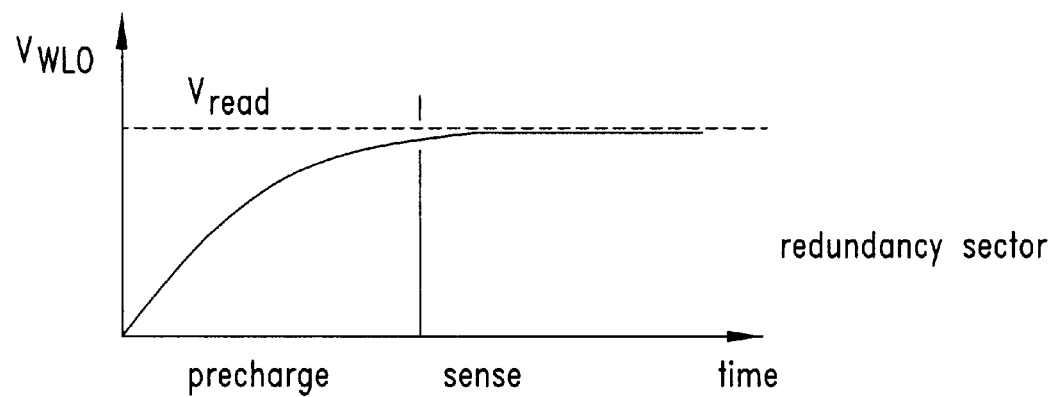
Figure 8:
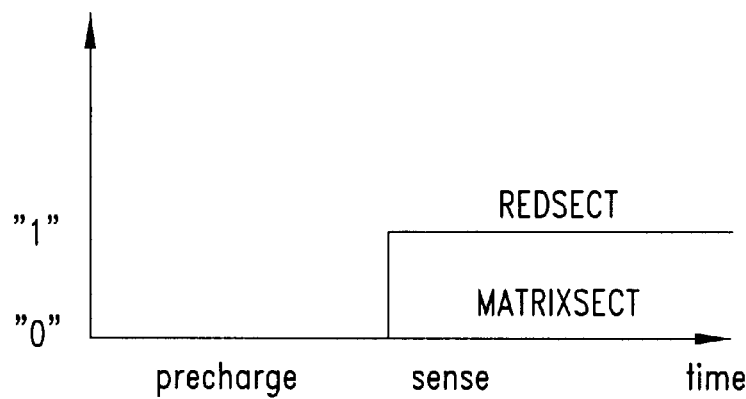
Figure 9:
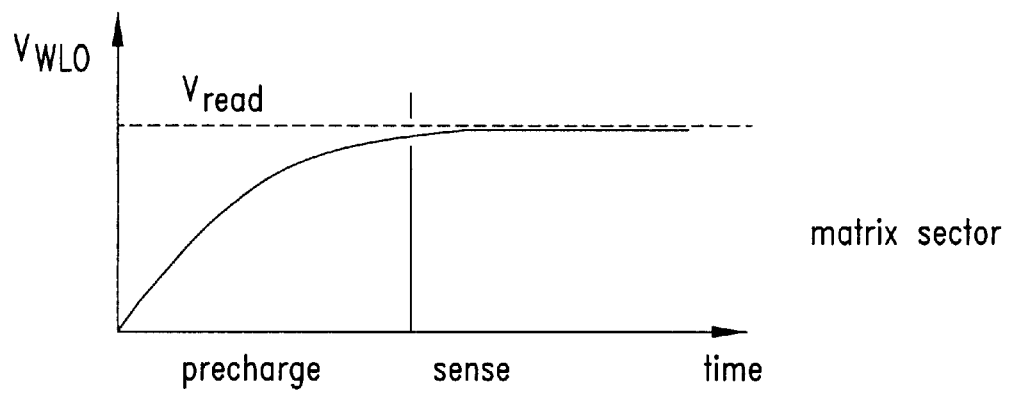
FIG. 9 shows a time diagram of the word-line tension in the case of not redundated matrix, according to the invention.
Figure 9:
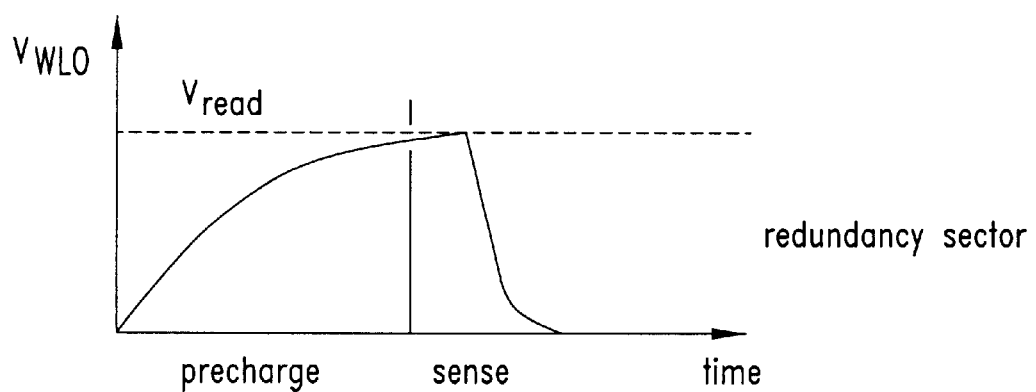
Figure 9:
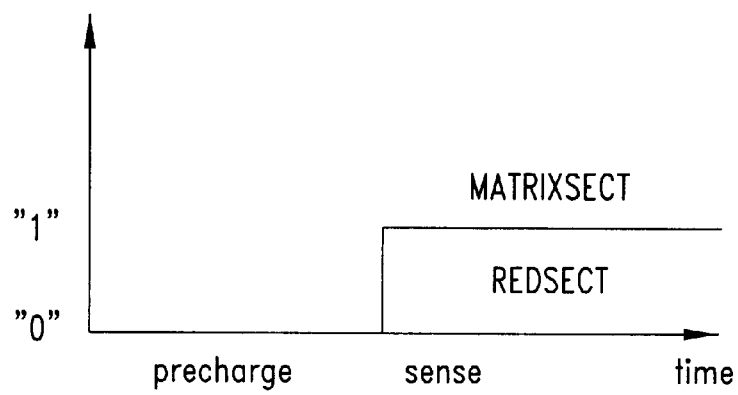

Subsequently, in order to limit the disturbing effects the deselection of the row that is not utilized is set. In fact there is provided the discharge of the selected matrix row (or of the redundancy one) in case the latter is effectively made redundant or not in order to limit the interference effects among nearby cells. In FIGS. 8 and 9 the time diagram of the word-line and bit line voltages relative to the cases of redundated matrix row (FIG. 8), and not redundated matrix row (FIG. 9).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A non-volatile memory device organized with memory cells arranged by rows and by columns, the memory device comprising: at least one sector of matrix cells; a first row decoder, suitable to decode address signals and to activate rows of said sector of matrix cells; at least one sector of redundancy cells for substituting a selected row of said sector of matrix cells with a selected row of said sector of redundancy cells; a second row decoder structured to decode the address signed and activate the selected row of said sector of redundancy cells; a first local column decoder for said sector of matrix cells; and a second local column decoder for said sector of redundancy cells, said row decoders being controlled by the address signals so that said selected row of said redundancy sector is activated by the address signals simultaneously with said selected row of said matrix sector.

2. The non-volatile memory device according to claim 1, further comprising global rows and global columns, said global columns being connected with local columns that are decoded by said first and second local column decoders.

3. The non-volatile memory device according to claim 2, wherein said first and second column decoders decode signals coming from a proper global column decoder.

4. The non-volatile memory device according to claim 3, wherein the number of decoding signals of said rows of said matrix cell sector is fixed equal to the number of decoding signals of said rows of said redundancy sector, in order to maximize the corrective power of said non-volatile memory device.

5. The non-volatile memory device according to claim 3, wherein the number of decoding signals of said rows of said matrix sector is higher than the number of decoding signals of said rows of said redundancy sector.

6. The non-volatile memory device according to claim 4, wherein said row of said selected matrix sector and said row of said selected redundancy sector have an identical decoding signal.

7. The non-volatile memory device according to claim 6, wherein said column decoders of said matrix sector and said redundancy sector are conditioned by signals coming from a proper circuitry.

8. A memory device, comprising:
a memory cell matrix sector that includes memory cells arranged by rows and columns;
a memory cell redundancy sector that includes memory cells arranged by rows and columns;
a first column decoder coupled to the matrix sector and structured to activate an addressed row of addressed cells in the matrix sector in response to receiving an address of the addressed row of addressed cells;
a second column decoder coupled to the redundancy sector and structured to activate a redundancy row of cells in the redundancy sector in response to receiving the address of the addressed row of addressed cells of the matrix sector;
a redundancy logic stage coupled to the first and second column decoders, the redundancy logic stage being structured to determine whether any of the addressed cells of the addressed row are defective, and if not, transmit a matrix selection signal to the first column decoder which causes the first column decoder to access the addressed cells in the addressed row, and if any of the addressed cells of the addressed row are defective, transmit a redundancy selection signal to the second column decoder which causes the second column decoder to access the redundancy row of cells of the redundancy sector corresponding to the addressed cells of the matrix sector.

9. The non-volatile memory device of claim 8 wherein the matrix sector includes a plurality of local bit lines each connected between the memory cells of a respective one of the columns of the matrix sector and the redundancy sector includes a plurality of local bit lines each connected between the memory cells of a respective one of the columns of the redundancy sector, wherein the local bit lines of the redundancy sector are separated from the local bit lines of the matrix sector.

10. The non-volatile memory device of claim 8 wherein the matrix sector and the redundancy sector share a global bit line.

11. The non-volatile memory device of claim 8, further comprising a global decoder that supplies decoding signals to both of the first and second column decoders.

12. The non-volatile memory device of claim 8 wherein the matrix sector includes a total number of rows that is equal to a total number of rows of the redundancy sector.

13. The non-volatile memory device of claim 8 wherein the matrix sector includes a total number of rows that is greater than a total number of rows of the redundancy sector.

14. The non-volatile memory device of claim 8 wherein the first column decoder is structured to activate the addressed cells of the matrix sector while the second column decoder activates corresponding cells of the redundancy sector.

15. A method of accessing memory cells of a memory device that includes a matrix of memory cells and a set of redundancy memory cells, the method comprising:

receiving an address that identifies an addressed plurality of the memory cells of the matrix and a corresponding plurality of the redundancy memory cells;

precharging the addressed plurality of memory cells and the corresponding plurality of redundancy memory cells simultaneously;

determining whether the addressed plurality of memory cells includes a defective memory cell;

accessing the addressed plurality of memory cells if the addressed plurality of memory cells does not include a defective memory cell; and accessing the corresponding plurality of redundancy memory cells if the addressed plurality of memory cells includes a defective memory cell.

16. The method of claim 15 wherein the determining step includes reading a register that indicates whether the addressed plurality of memory cells was determined during a testing stage to include a defective memory cell.

17. The method of claim 15 wherein the addressed plurality of memory cells includes a row of memory cells.

18. The method of claim 15 wherein the addressed plurality of memory cells includes a column of memory cells.

19. The method of claim 15 wherein the step of accessing the addressed plurality of memory cells includes using a first column decoder to select the addressed plurality of memory cells and the step of accessing the corresponding plurality of redundancy memory cells includes using a second column decoder to select the corresponding plurality of redundancy memory cells.

* * * * *